(12) United States Patent
Anjanappa et al.

(10) Patent No.: US 6,991,698 B2
(45) Date of Patent: Jan. 31, 2006

(54) MAGNETOSTRICTIVE FILM ACTUATORS USING SELECTIVE ORIENTATION

(75) Inventors: Muniswamappa Anjanappa, Ellicott City, MD (US); David T. Bach, Ellicott City, MD (US)

(73) Assignees: Scientific Products & Systems, Baltimore, MD (US); University of Maryland UMBC, Baltimore, MD (US)

( * ) Notice: Subject to any disclaimer, the term of this patent is extended or adjusted under 35 U.S.C. 154(b) by 145 days.

(21) Appl. No.: 10/690,766

(22) Filed: Oct. 22, 2003

(65) Prior Publication Data

US 2004/0086659 A1 May 6, 2004

Related U.S. Application Data

(60) Provisional application No. 60/421,635, filed on Oct. 25, 2002.

(51) Int. Cl.
*B32B 31/28* (2006.01)
(52) U.S. Cl. .................... 156/272.4; 156/275.5; 427/487; 427/130
(58) Field of Classification Search ......... 156/272.2, 156/272.4, 275.5, 275.7; 427/487, 508, 127, 427/130, 131, 372.2
See application file for complete search history.

(56) References Cited

U.S. PATENT DOCUMENTS 6,391,393 B1 * 5/2002 Martin et al. .............. 427/487

OTHER PUBLICATIONS

Anjanappa, M. and Wu, Y., "Magnetostrictive particulate actuators: configuration, modeling and characterization," Smart Mater. Struct., 1997, 6, 393-402.*

* cited by examiner

Primary Examiner—John T. Haran
(74) Attorney, Agent, or Firm—Clifford Kraft

(57) ABSTRACT

A method of making beams, clamps and other structures by curing a polymer containing a magnetostrictive material. A magnetostrictive material like TERFENOL-D™ is placed in a polymer. This mixture is put onto a slide in a film. The mixture is cured by UV light (or other means) so that it cross-links. A second layer of polymer with no magnetostrictive material can be cured on top of the first layer. This leads to a beam structure which exhibits a bending moment in an applied magnetic field. By aligning the magnetostrictive particles before curing with a magnetic field, a beam or other structure can be produced with aligned particles. A mask can be used to selectively cure regions where the magnetostrictive particles have different alignments on the same layer. It is possible to build up multiple layer structures with layers of magnetostrictive particles aligned in different directions.

17 Claims, 3 Drawing Sheets

MAGNETOSTRICTIVE FILM ACTUATORS USING SELECTIVE ORIENTATION

This application is related to and claims priority from U.S. Provisional patent application No. 60/421,635 filed Oct. 25, 2002 and hereby incorporates that application by reference.

BACKGROUND

1. Field of the Invention

The present invention relates generally to the field of biological instruments and more particularly magnetostrictive film smart material actuators.

2. Description of the Prior Art

TERFENOL-D™ is a magnetostrictive material that is commercially available and is currently being used to make rods and composites. This material changes size when exposed to an applied magnetic field. Magnetostrictive actuators with dimensions around 10 mm square by 3 mm thick have been build and are known to produce a large force and low amplitude motion at high frequencies. Actuators of similar size configured as prismatic structural beams have been modeled and characterized. Magnetostrictive films of thickness of more than 250 microns can be made by mixing magnetostrictive particles with a host resin. These films exhibit up to 200 microstrain when excited with a magnetic field. In addition to magnetostrictive films, piezoelectric material has been used to develop actuators for a variety of applications (for example, a piezo beam valve sensor for aircraft).

What is badly needed is to be able to make magnetostrictive films between 5–250 microns thick that exhibit good coupling between the particles and the host polymer, and that are easy to and cheap to fabricate.

SUMMARY OF THE INVENTION

The present invention relates to a method of making films of magnetostrictive material that exhibit a bending moment in an applied magnetic field or of making layers of magnetostrictive with regions pre-aligned in different directions. This can be done by mixing a magnetostrictive material with a UV curable polymer to form a material mixture; placing a film of the material mixture on a bottom glass (or other material) slide, and then partially curing the polymer with UV light in an oxygen free environment forming a partially cured layer. A second layer of polymer can be placed on top of the first layer and also cured. The result is a structure that exhibits a bending moment when a magnetic field is applied. Both layers can be finally cured by heat. The wavelength of the UV light is typically around 364 nm. A typical cross-linking polymer is DSM 4D6-73. A typical magnetostrictive material is TERFENOL-D.™ Any curable polymer and any magnetostrictive material can be used.

It is possible to align a portion of said first layer with a magnetic field prior to curing by applying a magnetic field, and then selectively curing only certain regions of the polymer with the UV light. The remaining uncured part can then be selectively aligned in a different direction and then also cured. The result is a film with different regions having the magnetostrictive particles aligned differently.

Several beams made by this process can be arranged in a rectangular or other pattern to make a clamp actuator where expansion or bending causes the actuator to close a hole or clamp.

It is also possible to build up multi-layer structures with different layers having different alignments.

Figure 1:
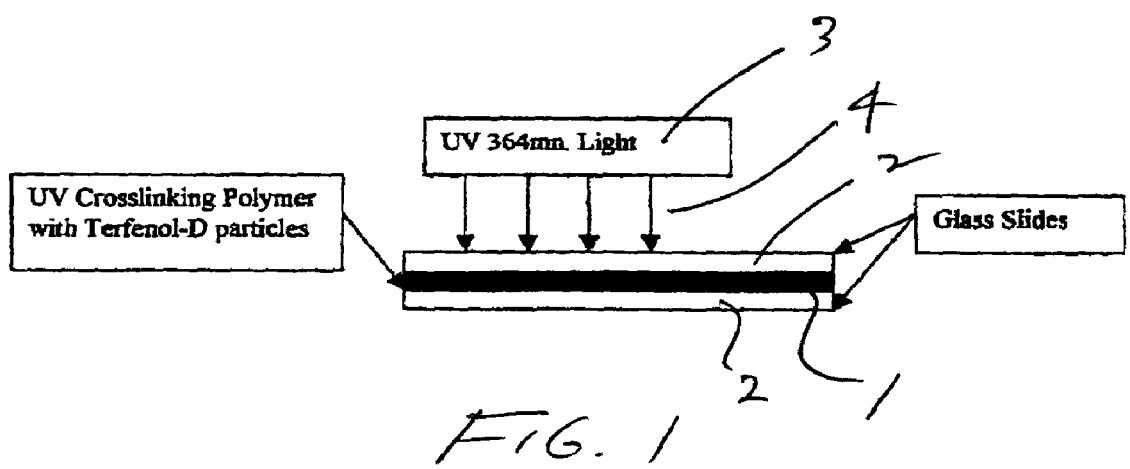
FIG. 1 shows a method of fabricating a magnetostrictive film.

Several illustrations have been presented to better illustrate the present invention. The invention is not limited to the embodiments shown in the drawings.

DESCRIPTION OF THE INVENTION

The present invention relates making magnetostrictive film actuators of thickness between 5–250 microns. An ultra-violet light (UV) curable polymer is used with TERFENOL-D™ particles to create a magnetostrictive film. FIG. 1 shows an embodiment of a process for making such a film. The magnetostrictive material is mixed with a cross-linking polymer such as DSM 4D6-73 or any other polymer with cross-linking properties. A thin coating of the polymer/magnetostrictive material 1 is placed between glass slides 2 or simply placed on a single slide. The slab is cured by UV light 4 from a light source 3 that supplies a wavelength of around 364 nm. The approximate UV exposure needed is 1 joule. It is important that cross-linking be accomplished in an oxygen-free environment. The top glass slide 2 is used to keep oxygen away from the polymer during curing. An alternative method is to cure the material in an inert atmosphere such as dry nitrogen.

The composite material can first be aligned by using a magnetic field followed by UV curing, or the material can be cured without alignment. If UV curing is accomplished using a mask, it is possible to create individual regions of particle orientations within a single or within multiple samples. To use a mask technique, one would align the polymer/particle mix in a magnetic field. The unmasked area would then be UV cross-linked. The sample could then be re-oriented in the magnetic field, and another region cured. This way the first region would be aligned according the its first position with respect to the field, and the second region would be aligned according to its second position with respect to the field. Any number of patterns or orientations can be generated this way.

Once the initial film has been established, a second polymer layer without particles is coated on one surface and UV cured. This second coating of equivalent or lesser stiffness than the base material can create a beam structure for bending. The total polymer assembly can then be finally cured at 110 degrees F. for about one hour. This completes the entire cross-linking of the polymer layers.

In the presence of an applied magnetic field, the magnetostrictive layer expands linearly. This expansion acting against the fixed second polymer layer creates a bending moment. The structure thus bends in an applied magnetic field. The bending can be caused to switch at least up to 12 kHz.

Figure 2:
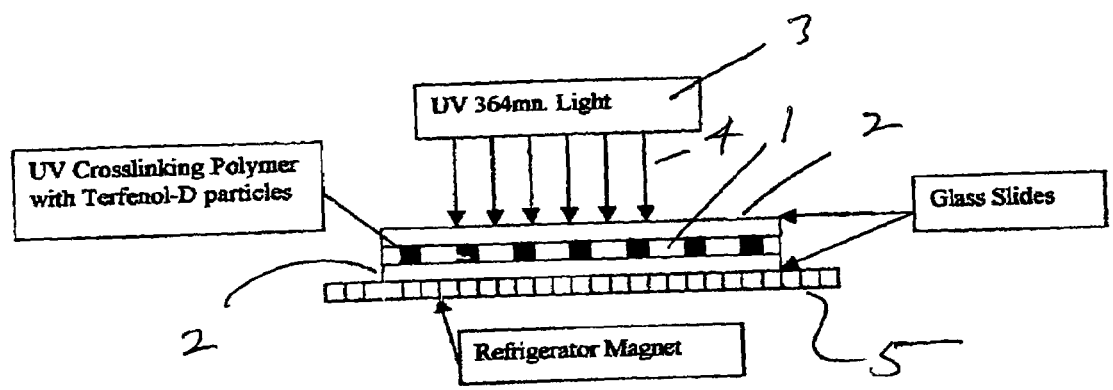
FIG. 2 shows an alternative method of fabricating a magnetostrictive film.

Several other embodiments of the curing process are possible. FIG. 2 shows a similar layout as that of FIG. 1 except that a sheet magnet 5 is placed under the sample prior to and optionally during curing. A refrigerator magnetic works well in this application. Here, the magnetostrictive particles become stacked in rows that correspond to the looping of the magnetic field lines between the magnet elements.

If an aligned magnetic field is applied, the particles will line up in the direction of the field. If the number of particles in the polymer mix is relatively low, the particles will migrate and chain together to form discrete lines. If the number of particles is high, the particles will tend to align with minimal discrete spaces between the lines.

The particles can be aligned various ways and then locked in the desired configuration using the UV light to partially cure the polymer. As stated before, a mask can be used to align different parts of the material in different directions.

Figure 3:
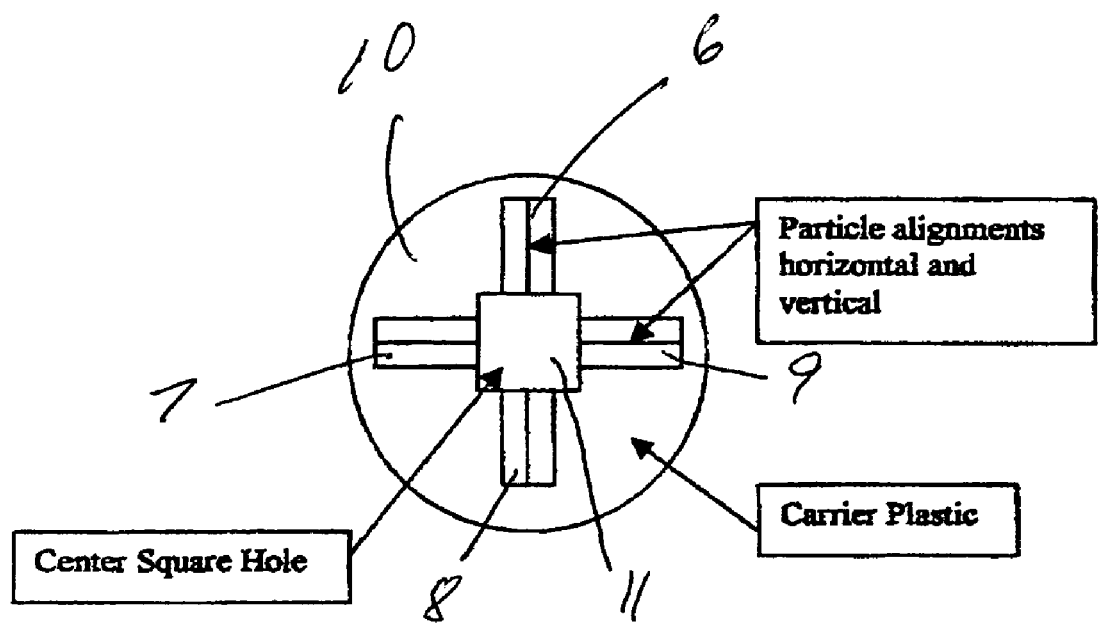
FIG. 3 shows a smart material clamp.

FIG. 3 shows an example where there are four pads 6, 7, 8, 9 with two vertical and two horizontal elements that can create a smart material clamp. The pads are mounted on a piece of plastic 10 or other material. A hole 11 (which can be square or any other shape) can be placed between the pads. When a magnetic field is applied, the elongation of the pads can clamp the hole. This embodiment can be arranged so that a vertical magnetic field actuates two of the pads, and a horizontal magnetic field actuates the other two pads.

It is possible to build up composite beams and other structures using alternating layers of polymer with magnetostrictive material and polymer with no magnetostrictive material. In addition, different layers containing magnetostrictive material can be aligned in different directions with a magnetic field before curing.

Various descriptions and illustrations have been used to characterize the present invention. It will be recognized that many changes and variations are possible. These changes and variations are within the scope of the present invention. The scope of the present invention is not limited to the embodiments or figures presented herein.

I claim:

1. A process for making a magnetostrictive actuator comprising the steps of:
   mixing a magnetostrictive material with a UV curable polymer to form a material mixture;
   placing a first film of said material mixture on a bottom slide;
   partially curing said polymer with UV light in an oxygen free environment forming a partially cured layer;
   placing a second film of said UV curable polymer on said partially cured layer and curing said second film, whereby said first and second films form a composite beam.

2. The process of claim 1 wherein said first and second films are further cured by heat.

3. The process of claim 1 further comprising aligning a portion of said first layer with a magnetic field prior to curing.

4. The process of claim 1 wherein said UV light is around 364 nm wavelength.

5. The process of claim 1 further comprising using a plurality of said beams made by said process arranged in a predetermined pattern to make a clamp actuator.

6. A method of forming a magnetostrictive actuator comprising the steps of placing a magnetostrictive material and a cross-linking polymer on a base, aligning said magnetostrictive material in a first direction with a magnetic field, curing at least one region of said polymer, aligning magnetostrictive material in uncured regions of said polymer in a second direction with a magnetic field, curing at least one second region of said polymer, whereby at least two regions of cured polymer are created with magnetostrictive material aligned in at least two different directions.

7. The method of claim 6 further comprising curing a top layer of polymer on said previously cured polymer, where said previously cured layer of polymer contains magnetostrictive material and said top layer of polymer contains almost no magnetostrictive material.

8. The method of claim 6 wherein said curing is by UV light.

9. The method of claim 8 wherein said UV light has a wavelength of around 364 nm.

10. The method of claim 6 wherein said first region of polymer is selected with a mask.

11. A method of producing a magnetostrictive actuator comprising the steps of placing a first polymer layer on a glass slide, said first polymer layer containing a magnetostrictive material, curing at least a portion of said polymer on said slide, placing a second polymer layer on said first polymer layer, curing said second polymer layer.

12. The method of claim 11 wherein said curing is with a UV light source.

13. The method of claim 12 wherein said UV light source has a wavelength of around 364 nm.

14. The method of claim 11 further comprising placing a sheet magnet under said glass slide before said curing.

15. The method of claim 11 further comprising placing a second glass slide over said polymer layers during curing.

16. The method of claim 11 further comprising making multiple layers of polymer with magnetostrictive material and polymer without magnetostrictive material.

17. The method of claim 16 wherein at least two of said layers with magnetostrictive material are aligned in different directions.

* * * * *